United States Patent [19]

Baldi et al.

[11] Patent Number: 5,818,760
[45] Date of Patent: Oct. 6, 1998

[54] METHOD AND DEVICE FOR SUPPLYING NEGATIVE PROGRAMMING VOLTAGES TO NON-VOLATILE MEMORY CELLS IN A NON-VOLATILE MEMORY DEVICE

[75] Inventors: Livio Baldi, Agrate Brianza; Federico Pio, Milan, both of Italy

[73] Assignee: SGS-Thomson Microelectronics S.r.l., Agrate Brianza, Italy

[21] Appl. No.: 871,226

[22] Filed: Jun. 9, 1997

Related U.S. Application Data

[60] Continuation of Ser. No. 639,931, Apr. 26, 1996, Pat. No. 5,659,501, which is a division of Ser. No. 344,232, Nov. 23, 1994, Pat. No. 5,528,536.

[30] Foreign Application Priority Data

Nov. 24, 1993 [EP] European Pat. Off. .............. 93830464

[51] Int. Cl.[6] ..................................................... G11C 7/00
[52] U.S. Cl. ............................ 365/185.18; 365/185.23; 365/185.26; 365/189.09; 365/149
[58] Field of Search ..................... 365/185.18, 185.23, 365/185.26, 189.09, 149

[56] References Cited

U.S. PATENT DOCUMENTS

| | | | |
|---|---|---|---|
| 4,368,524 | 1/1983 | Nakamura et al. ..................... | 365/226 |
| 4,435,785 | 3/1984 | Chapman ................................ | 365/147 |
| 4,797,899 | 1/1989 | Fuller et al. ............................ | 375/7 |
| 5,077,691 | 12/1991 | Haddad et al. ........................ | 365/218 |
| 5,103,160 | 4/1992 | Bohac, Jr. .............................. | 323/351 |
| 5,331,188 | 7/1994 | Acovic et al. ......................... | 257/298 |
| 5,371,705 | 12/1994 | Nakayama et al. ................. | 365/189.09 |
| 5,428,568 | 6/1995 | Kobayashi et al. .................... | 365/185 |
| 5,436,552 | 7/1995 | Kajimoto et al. ..................... | 323/313 |
| 5,528,536 | 6/1996 | Baldi et al. ........................ | 365/185.18 |
| 5,659,501 | 8/1997 | Baldi et al. ........................ | 365/185.18 |

FOREIGN PATENT DOCUMENTS 0 456 623 A2  11/1991  European Pat. Off. .

*Primary Examiner*—Viet Q. Nguyen
*Attorney, Agent, or Firm*—David V. Carlson; Bryan A. Santarelli; Seed and Berry LLP

[57] ABSTRACT

A programming voltage is supplied to a control gate of a non-volatile memory cell via a control gate line. A supply voltage is coupled to a first plate of a capacitor and a reference voltage is coupled to a second plate of the capacitor. The supply voltage is then uncoupled from the first plate and the reference voltage is uncoupled from the second plate. Next, the reference voltage is coupled to the first plate to generate the programming voltage on the second plate.

17 Claims, 3 Drawing Sheets

METHOD AND DEVICE FOR SUPPLYING NEGATIVE PROGRAMMING VOLTAGES TO NON-VOLATILE MEMORY CELLS IN A NON-VOLATILE MEMORY DEVICE

CROSS-REFERENCES TO RELATED APPLICATIONS

This application is a continuation of U.S. patent application Ser. No. 08/639,931, filed Apr. 26, 1996, now U.S. Pat. No. 5,659,501 which is a divisional of U.S. patent application Ser. No. 08/344,232, filed Nov. 23, 1994, which issued as U.S. Pat. No. 5,528,536 on Jun. 18, 1996.

TECHNICAL FIELD

The present invention relates generally to electronic devices and, more specifically, to a method for supplying negative programming voltages to non-volatile memory cells in a non-volatile memory device, and to an integrated structure for actuating such method.

BACKGROUND OF THE INVENTION

It is known that EEPROM and Flash EEPROM memory devices can be programmed in one or another of two logical states by respectively introducing electrons into or removing electrons from the memory cells' floating gates. This latter operation is termed "writing" in EEPROMs, while in Flash EEPROMs, it is referred to as "erasure".

The removal of electrons from a cell's floating gate is accomplished by tunnelling electrons from the floating gate into an underlying N+ diffusion, which in the case of a Flash EEPROM device constitutes the source region of the cell, and in an EEPROM device can represent either the source or the drain region of the cell, through a thin oxide region called "tunnel oxide"; electron tunnelling takes place if the potential difference between the floating gate and said underlying diffusion is made negative and its absolute value exceeds a value depending on the cells' characteristics.

A common technique provides for grounding the cell's control gate (which is capacitively coupled to the floating gate), while raising the underlying diffusion potential to a value generally higher than 10 V.

When, however, the diffusion potential is raised to such values, band-to-band tunnelling causes significant leakage currents to appear, thereby making it impossible to program the memory device by just supplying it one single voltage supply, or to use the memory device in a battery-supplied environment.

To overcome such a problem, a different technique has been introduced, which provides for lowering the control gate potential to a negative value (with respect to the ground reference voltage) ranging from –6 V to –8 V and generated by a circuitry internal to the memory device, and raising the potential of the N+ diffusion under the tunnel oxide to a moderately high value, for example corresponding to the voltage supply value of the memory device.

A circuit implementing this technique is described in U.S. Pat. No. 5,077,691, and comprises three P-channel MOSFETs, two of which are connected in series between the output of a positive high voltage (Vpp) source and an N-channel MOSFET having a source connected to ground, while the third is connected between the common node of the previous two MOSFETs and the output of a negative high voltage (Vnn) source; the common node to which the three MOSFETs are connected represents a control gate line or word line that is connected to the control gates of the cells to be programmed; the Vpp and Vnn sources are constituted by charge pumps or voltage boosters internal to the memory device, and generally located at the periphery of the chip.

To transfer electrons to the floating gates of the cells to be programmed, the charge pump for generating Vpp is activated, and the MOSFET connected between Vpp and the control gate line is on; the remaining two MOSFETs are instead kept off, and the charge pump for generating Vnn is deactivated. It is thus possible to transfer the voltage Vpp to the control gate line.

To remove electrons from the floating gates of the cells to be programmed, the charge pump generating Vnn is activated, the two serially-connected MCSFET are kept off, and the third MOSFET is on, so that Vnn can be transferred to the control gate line. The voltage effectively transferred to the control gate line is actually given by the voltage applied to the gate of the third MOSFET minus the MOSFET threshold voltage (which is negative since P-channel MOSFETs are used); the gate voltage of the third MOSFET is never equal to Vnn, since voltage drops always occur between the output of the Vnn charge pump and the gate of the third MOSFET, due to the long interconnection line and the presence of selection transistors. The gate voltage of the third MOSFET is, therefore, in an absolute value sense, lower than Vnn.

Because the third MOSFET has its source connected to the control gate line and the body (i.e., the N well in which the P-channel MOSFETs are obtained) connected to ground, the MOSFET threshold voltage increases (in absolute value) and the voltage effectively transferred to the control gate line can be 2 or 3 V higher than the voltage applied to the gate of the MOSFET. This value could be not sufficiently negative to start tunnelling of electrons.

A possible solution to the above-mentioned problem provides for voltage boosting the gate of the third MOSFET, at the expense of an increase in both the complexity of the circuit and in the total memory-chip area.

SUMMARY OF THE INVENTION

In view of the state of the art just described, an object of the present invention is to provide a method for supplying negative voltages to non-volatile memory cells in a non-volatile memory device, such method being suitable for being actuated by a structure which, without increasing significantly the total chip area, is not affected by the above-mentioned problems.

According to one aspect of the present invention, such object is attained by means of a method for supplying negative programming voltages to non-volatile memory cells in a non-volatile memory device, each memory cell comprising a floating gate and a control gate, characterized in that it provides for charging a capacitor to a positive high voltage by connecting a first plate of the capacitor to a positive high-voltage supply and connecting a second plate of the capacitor, which is also operatively connected to the control gate of at least one memory cell, to a reference voltage supply, and for successively connecting the first plate of the capacitor to the reference voltage supply and disconnecting the second plate of the capacitor from the reference voltage supply to obtain a negative voltage on said second plate.

According to another aspect of the invention, such method is accomplished by means of a structure, suitable for being integrated in a non-volatile memory device comprising a matrix of memory cells each comprising a floating gate and a control gate, said matrix comprising a plurality of word lines each of which is connected to a plurality of control gates, comprising at least one elementary circuit constituted by a capacitor, first switching means for alternatively connecting a first plate of the capacitor to a positive high-voltage supply or to a reference voltage supply, and second switching means for respectively connecting or disconnecting a second plate of the capacitor, which is also operatively connected to at least one of said word lines, to the reference voltage supply.

One advantage of the inventive structure is that the basic circuit occupies a limited area making it possible to accomplish a memory device in which each word line is closely connected, at its ends, to a respective elementary circuit (which works as a "local" negative voltage charge pump) so that the negative voltage required to program the memory cells connected to a selected word line is generated directly on such word line; in this case, it is only necessary to provide the memory device with a positive voltage charge pump.

Alternatively, it is also possible to use the elementary circuits as "local" voltage boosters to overdrive the gate electrodes of selection transistors which are connected in series between the word lines and the output of a conventional negative voltage charge pump.

Other embodiments are also possible, such as wherein one elementary circuit, working as a "local" negative voltage charge pump, is associated with a group of word lines, the gate of the selection transistors in series to each word line of said group being overdriven by a respective elementary circuit working as a "local" voltage booster; in this case, as in the first mentioned case, no negative voltage charge pumps are necessary at the periphery of the chip.

The features of the present invention shall be made more evident by the following detailed description of the disclosed embodiments, illustrated as non-limiting examples in the annexed drawings, wherein.

DESCRIPTION OF THE INVENTION

Figure 1:
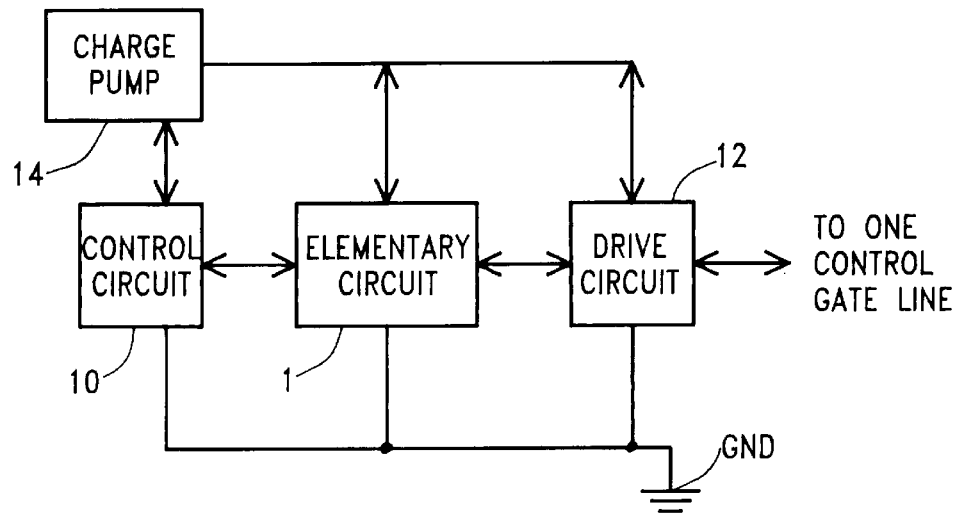
FIG. 1 is a block diagram of a structure according to a first embodiment of the present invention.

FIG. 1 shows a block diagram of a circuit according to a first embodiment of the present invention for programming non-volatile memory cells (not shown). The circuit includes a controller 10 for generating control signals for an elementary circuit 1, and a drive circuit 12. A charge pump 14 may be included for generating a positive voltage that is typically a programming voltage Vpp. Alternatively, Vpp may be generated external to the memory chip (not shown).

In operation and according to one aspect of the invention, the drive circuit 12 supplies programming and erasing voltages to the control gates of non-volatile memory cells. The elementary circuit 1 generates a negative voltage from a positive voltage. The drive circuit 12 uses this negative voltage to generate a negative erasing voltage that it uses to extract electrons from a floating gate of a selected non-volatile memory cell, i.e., to erase the cell. To inject electrons into such a floating gate, the drive circuitry provides the positive voltage, which is typically the programming voltage Vpp, to the control gate. Although described with a positive programming voltage and a negative erasing voltage, the present invention contemplates a negative programming voltage and positive erasing voltage.

Figure 2:
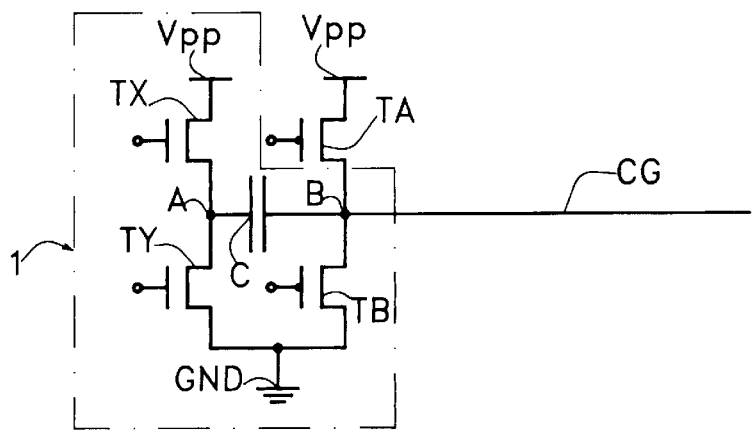
FIG. 2 is a schematic diagram of a structure according to the first embodiment of the invention.

In FIG. 2 a schematic diagram of an elementary circuit 1 according to the invention for generating a negative voltage starting from a positive high voltage supply Vpp, typically a programming voltage, is shown. The circuit 1 comprises a first MOSFET TX whose drain and source are respectively connected to a positive high voltage supply line Vpp and to a first node A, a second MOSFET TY with drain and source respectively connected to node A and to a reference voltage line GND, a third MOSFET TB whose drain and source are respectively connected to the reference voltage line GND and to a second node B representing a negative voltage output of the elementary circuit 1 and to which in this embodiment a control gate line CG (constituting a word line of the memory matrix) is also connected, and a capacitor C connected between node A and node B. Non-volatile memory cells (not shown) are connected to the control gate line CG by their control gates. A fourth MOSFET TA with source and drain respectively connected to Vpp and to node B is also shown, and is used in a per se know way to transfer to the control gate line CG the voltage Vpp when electrons are to be transferred to the floating gates of the memory cells connected to CG. TA and TB are P-channel MOSFETs, while in the example of FIG. 2 TX and TY are high-voltage N-channel MOSFETs, but could as well be both P-channel MOSFETs, or one a P-channel and the other an N-channel MCSFET. The high voltage supply line Vpp can be obtained by connecting to an external high-voltage supply, or to the output of a conventional charge pump 14, shown in FIG. 1. In the latter embodiment, Vpp is obtained starting from a supply voltage applied externally to the memory device and the charge pump 14 raises it to a value sufficient to determine the transfer of electrons, either by tunnelling (EEPROMs) or by hot electron injection (Flash EEPROMs) to the floating gates of the memory cells. The details of such charge pumps are known in the art and any suitable charge pump circuitry of the art is acceptable. Said charge pump 14 is normally located at the periphery of the memory device chip.

When electrons are to be transferred to a floating gate of a selected cell whose control gate is connected to the control gate line CG, TA is turned on by applying to its gate electrode the reference voltage GND, while TB is kept off by applying to its gate electrode the high voltage Vpp. In this condition the control gate line CG voltage is raised to Vpp. In order to reduce the parasitic capacitances to be charged in this phase, TX and TY should also be kept in the off state so that node A is left floating.

When electrons are to be extracted from a floating gate of a selected cell belonging to the word line CG, TA is turned off, while TB and TX are turned on by applying to their gate electrodes the voltages GND and Vpp, respectively; this causes node A to be connected to Vpp and node B to be grounded; this fact determines the charging of capacitor C to the voltage Vpp. In the case that TX is a P-channel MOSFET, the reference voltage GND is applied to its gate electrode to turn TX on. After capacitor C has been charged, TX and TB are turned off and TY is turned on, so that the potential on node A is lowered from Vpp to ground. This causes, by charge conservation, the potential on node B (i.e., on the control gate line CG) to drop to a negative potential given by the partition of the charge stored in the capacitor C between C and the parasitic capacitances associated with the control gate line CG, and with TA and TB: the higher the value of C compared to said parasitic capacitances, the better said negative potential approximates −Vpp. Since the control gate capacitance of a memory cell is essentially determined by the active area region of the cell (which actually represents a small portion of the total cell area), and since negative potentials on the control gate line CG ranging from −0.5Vpp to −0.7Vpp are sufficient to start electron tunnelling, the value of capacitor C does not have to be very high, and the total memory chip area is not significantly increased. If, for example, the memory device is fabricated in a 0.8 mm technology and the capacitor C is obtained using as plates the two polysilicon layers constituting the floating gate and the control gate of the memory cells, a negative potential of about −0.5Vpp can be obtained on the control gate line CG provided that C has at least an area of 3 mm2 per bit, i.e., per each cell connected to the control gate line CG; this value should be compared to the cell's area, which in the case of an EEPROM device ranges from 15 mm2 to 20 mm2, while for Flash EEPROMs it ranges from 7 mm2 to 12 mm2. The capacitor C could also be obtained using as plates one polysilicon layer and an underlying N-type diffusion.

In one aspect of the invention, the MOSFET TA must be able to sustain a voltage of approximately 2Vpp between source and drain; alternatively, the source of MOSFET TA could be disconnected from the output of the charge pump generating Vpp before TY is turned on.

Furthermore, it is possible to control the shape of the voltage pulse applied to CG, i.e., to sharpen or to smooth its edges, by just modulating the conductivity of TY.

By providing each word line of the memory matrix with a respective elementary circuit 1, no negative voltage charge pumps are required to program the memory cells, since the negative voltage is generated directly on the selected word line of cells to be programmed by the elementary circuit 1.

Figure 3:
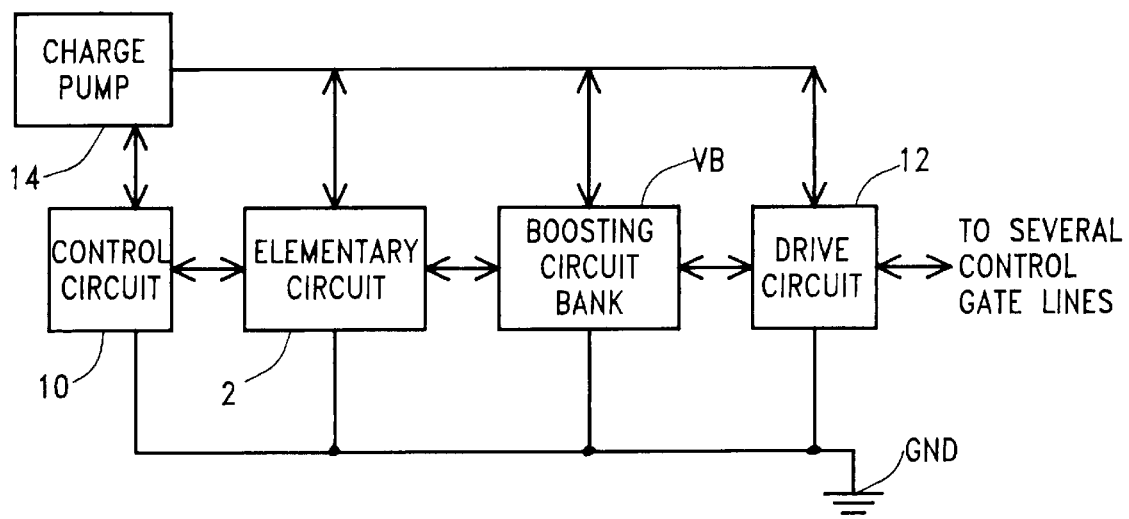
FIG. 3 is a block diagram of a structure according to a second embodiment of the present invention.

FIG. 3 shows a block diagram of a circuit according to a second embodiment of the present invention for programming non-volatile memory cells (not shown). The circuit includes a controller 10 for generating control signals for an elementary circuit 2, a plurality of overdrive or boosting circuits VB, and a plurality of drive circuits 12. A charge pump 14 may be included for generating a positive voltage that is typically a programming voltage Vpp. Alternatively, Vpp may be generated external to the memory chip (not shown).

In operation and according to one aspect of the invention, the drive circuit 12 supplies programming and erasing voltages to the control gates of non-volatile memory cells. The elementary circuit 2 generates a negative voltage from a positive voltage. The boosting circuit VB couples this negative voltage to the drive circuit 12, which uses this negative voltage to generate a negative erasing voltage that it uses to extract electrons from a floating gate of a selected non-volatile memory cell, i.e., to erase the cell. To inject electrons into such a floating gate, the drive circuitry provides the positive voltage, which is typically the programming voltage Vpp, to the control gate.

Figure 4:
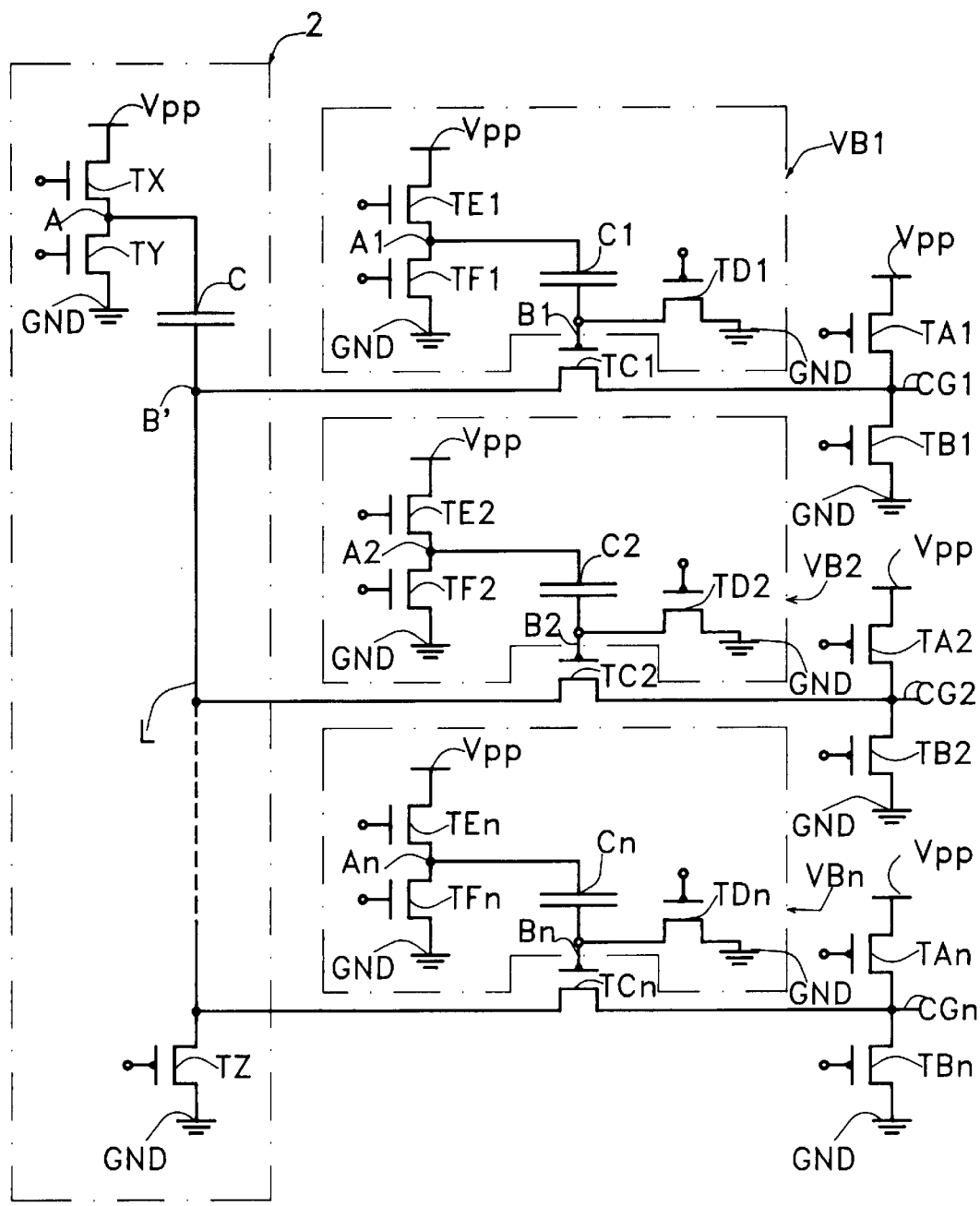
FIG. 4 is a schematic diagram of a structure according to the second embodiment of the invention.

FIG. 4 shows a schematic diagram of the second embodiment of the invention wherein, differently from the previous embodiment, a single elementary circuit 2, which generates a negative voltage starting from Vpp, is associated with a group of control gate lines CG1–CGn.

The two MOSFETs TX and TY and the capacitor C are substantially identical to those described in the previous embodiment; one plate of C is, however, connected to a node B' to which, through a line L, the drains of a plurality of P-channel selection MOSFETs TC1–TCn are also connected; each MOSFET of said plurality TC1–TCn has the source connected to a respective control gate line CG1–CGn. A P-channel MOSFET TZ is also connected by its source to node B', and by its drain to the reference voltage line GND. Connected to each control gate line CG1–CGn are a pair of P-channel MOSFETs TA1–TAn and TB1–TBn, which are used, in a per se known manner, during the phase of transfer of electrons to the floating gates of the memory cells.

The gate electrode B1–Bn of each MOSFET TC1–TCn is connected to a respective voltage boosting circuit VB1–VBn, which is substantially identical in its structure to the elementary circuit 2: each circuit VB1–VBn is in fact composed by two N-channel MOSFETs TE1–TEn and TF1–TFn serially connected, similarly to TX and TY, between the Vpp line and the GND line; the common node A1–An to which TE1–TEn and TF1–TFn are connected is also connected to one plate of a capacitor C1–Cn; the second plate of C1–Cn is connected to the gate electrode B1–Bn of TC1–TCn and to the source of a P-channel MCSFET TD1–TDn equivalent in its functions to TZ; the drains of TD1–TDn are connected to the reference voltage line GND.

When electrons are to be transferred to the floating gate of a memory cell connected to a selected control gate line, for example CG1, the MOSFETs TC1–TCn are kept off; TA2–TAn and TB1–TBn are also kept off, while TA1 is activated to transfer to the control gate line CG1 the voltage Vpp.

When electrons are to be removed from the floating gate of a memory cell connected to a selected control gate line, for example CG1, all the MOSFETs TA1–TAn and TB1–TBn are kept off; the MOSFETs TC1–TCn are also initially in the off state. The capacitor C is charged to Vpp by activating TX and TZ and disactivating TY; in this way, the potential on node A is given by Vpp, while node B', and therefore the whole line L, is grounded.

The voltage booster circuit VB1 is then activated by turning on TE1 and TD1 (TF1 is kept off) so that C1 can charge to Vpp; after C1 has been charged, TE1 and TD1 are turned off, and TF1 is turned on, so that the potential on the gate electrode B1 of TC1 is lowered to approximately −Vpp, for the reasons described with reference to the first embodiment.

TX and TZ are then turned off and TY is turned on, so that the potential on node B' is lowered to −Vpp; the MOSFET TC1 can therefore transfer to the control gate line CG1 the negative voltage of the line L. Since the remaining voltage boosters VB2–VBn are deactivated, the MOSFETs TC2–TCn are in the off state, and do not transfer the negative potential on line L to the unselected control gate lines CG2–CGn.

After the electrons have been removed from the floating gate of the selected cell, the line L is grounded by the turning on of TZ.

By properly dimensioning C1–Cn, it is possible to overdrive the gate electrode B1–Bn of TC1–TCn so that the entire voltage on node B' can be transferred to the control gate lines CG1–CGn.

Figure 5:
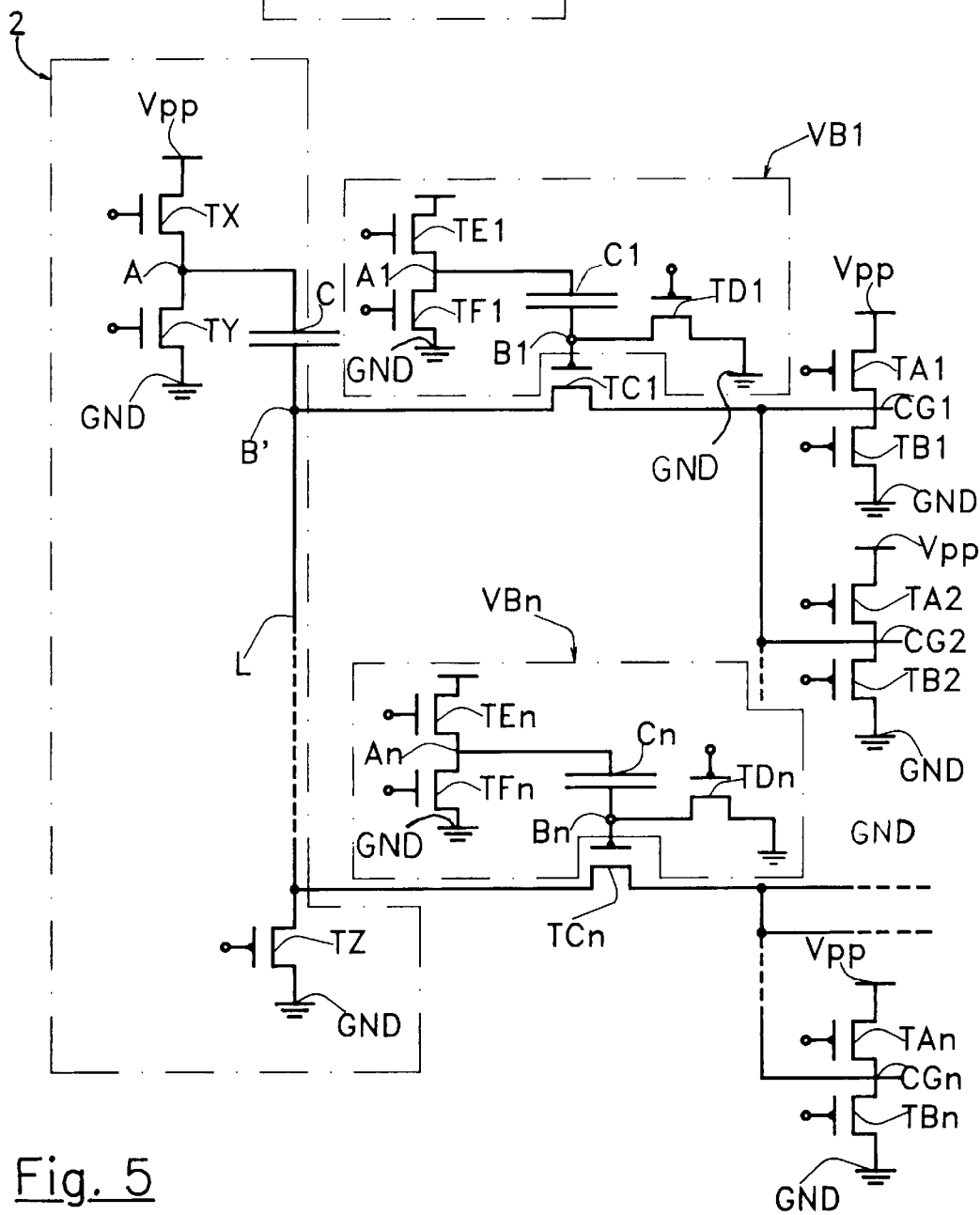
FIG. 5 is a schematic diagram of a structure according to a third embodiment of the invention.

In FIG. 5 a third embodiment is shown wherein, differently from the embodiment of FIG. 4, groups of control gate lines CG1–CGn are connected in parallel to the source of a same selection MOSFET TC1–TCn; this arrangement allows a reduction in the memory device area, and is particularly suitable for EEPROM devices.

The circuit of FIG. 5 behaves in substantially the same way of the circuit of FIG. 4. The only difference from the previous embodiment is that when electrons are to be removed from the floating gate of memory cells belonging to a control gate line of a given group, the negative voltage on node B' is applied simultaneously to all the control gate lines of said group; non-selected cells are, however, not affected by this fact, since each EEPROM cell is associated with a selection transistor (not shown), which isolates non-selected cells.

If leakage currents associated with the drain diffusion of TC1–TCn are significant, thus causing the capacitor C to discharge and the negative potential on node B' to raise towards the reference voltage GND, it is possible to periodically refresh the potential on B' by repeating the procedure described above: firstly, all the selection MOSFETs TC1–TCn are turned off; then TY is turned off; afterwards, TX and TZ are turned on, so that C is again charged to Vpp; TX and TZ are now turned off and TY is turned on, so that B drops to a negative potential; finally, the negative potential is again transferred to the selected control gate line CG1–CGn by turning on the respective selection MOSFET TC1–TCn. This procedure can be repeated periodically, so that an almost steady value of potential on node B' is attained during the extraction of electrons from the floating gates of the selected memory cells. In this case, the elementary circuit 2 acts as a single stage-charge pump, and the steady-state potential value on the selected control gate line is reached after a transient of a given number of cycles, depending on the capacitance of capacitor C; it is therefore possible to reduce the area of said capacitor C with a corresponding increase of the number of charge-discharge cycles during each programming operation.

In both the embodiments of FIGS. 4 and 5, the line L could be connected to the output of a conventional negative voltage charge pump instead of to elementary circuit 1; in this case the voltage boosters VB1–VBn are allowed to overdrive the gate of the selection transistors TC1–TCn to achieve an effective transfer of negative voltage to the selected control gate line CG.

It will be appreciated that, although various embodiments of the invention have been described herein for purposes of illustration, modifications may be made without departing from the spirit and scope of the invention. Accordingly, the invention is not limited except as by the appended claims.

We claim:

1. A circuit for supplying a programming voltage to a control gate of a non-volatile memory cell, the device comprising:
    a first capacitor having a first plate and having a second plate coupled to said control gate;
    a first switching circuit for selectively coupling said first plate to a first voltage or to a reference voltage;
    a second switching circuit for selectively coupling said second plate to said reference voltage; and
    a control circuit for controlling said first and second switching circuits to charge said capacitor by coupling said first and second plates to said first voltage and to said reference voltage, respectively, and for controlling said first and second switching circuits to generate said programming voltage on said control gate by coupling said first plate to said reference voltage and by uncoupling said second plate from said reference voltage, respectively.

2. The circuit of claim 1, further comprising a third switching circuit coupled to said second plate and the control gate for selectively coupling said second plate to the control gate.

3. The circuit of claim 1, further comprising:
    a second capacitor having first and second plates;
    a third switching circuit for selectively coupling said first plate of said second capacitor to said first voltage or said reference voltage;
    a fourth switching circuit for selectively coupling said second plate of said second capacitor to said reference voltage;
    a fifth switching circuit coupled to said second plate of said first capacitor and said control gate; and
    said control circuit for controlling said third and fourth switching circuits to charge said second capacitor by coupling said first and second plates of said second capacitor to said first and reference voltages, respectively, for controlling said third and fourth switching circuits to generate a potential on said second plate of said second capacitor by coupling said reference voltage to said first plate of said second capacitor and uncoupling said reference voltage from said second plate of said second capacitor, respectively, and for controlling said fifth switching circuit to couple said second plate of said first capacitor to said control gate in response to said potential.

4. The circuit of claim 1, further comprising a charge pump for generating said first voltage.

5. A circuit for generating a programming voltage for a non-volatile memory cell having a control gate, the circuit comprising:
    first and second supply terminals;
    a capacitor having a first capacitor terminal and having a second capacitor terminal coupled to the control gate;
    a first switch having a control terminal, a first terminal coupled to the first supply terminal, and a second terminal coupled to the first capacitor terminal;
    a second switch having a control terminal, a first terminal coupled to the first capacitor terminal, and a second terminal coupled to the second supply terminal;
    a third switch having a control terminal, a first terminal coupled to the second capacitor terminal, and a second terminal coupled to the second supply terminal; and
    a control circuit coupled to the control terminals of the first, second, and third switches, the control circuit operable to charge the capacitor by closing the first and third switches and opening the second switch, the control circuit operable to generate the programming voltage on the control gate by opening the first and third switches and closing the second switch.

6. The circuit of claim 5 wherein the first, second, and third switches each comprise a respective transistor.

7. The circuit of claim 5 wherein:
    the first supply terminal is operatively coupled to receive a positive voltage; and
    the programming voltage comprises a negative voltage.

8. A circuit for generating programming voltages for a non-volatile memory cell having a control gate, the circuit comprising:
    first and second supply terminals;
    a capacitor having a first capacitor terminal and having a second capacitor terminal coupled to the control gate;
    a first switch having a control terminal, a first terminal coupled to the first supply terminal, and a second terminal coupled to the first capacitor terminal;
    a second switch having a control terminal, a first terminal coupled to the first capacitor terminal, and a second terminal coupled to the second supply terminal;
    a third switch having a control terminal, a first terminal coupled to the second capacitor terminal, and a second terminal coupled to the second supply terminal;
    a fourth switch having a control terminal, a first terminal coupled to the first supply terminal, and a second terminal coupled to the second capacitor terminal; and
    a control circuit coupled to the control terminals of the first, second, third, and fourth switches, the control circuit operable to charge the capacitor by closing the first and third switches and opening the second switch, the control circuit operable to generate a first programming voltage on the control gate by opening the first and third switches and closing the second switch, the control circuit operable to generate a second programming voltage on the control gate by closing the fourth switch and opening the third switch.

9. The circuit of claim 8 wherein:

the first supply terminal is operatively coupled to receive a positive voltage;

the first programming voltage comprises a positive voltage; and the second programming voltage comprises a negative voltage.

10. The circuit of claim 8 wherein the control circuit is operable to open the first and second switches while generating the second programming voltage.

11. A memory, comprising:

first and second voltage terminals;

non-volatile memory cells arranged in rows;

word lines each coupled to the memory cells in a respective row;

a first capacitor having first and second capacitor terminals;

a first switching circuit coupled to the first capacitor terminal and to the first and second voltage terminals;

a second switching circuit coupled to the second capacitor terminal and to the second voltage terminal;

an interface circuit coupled to the second capacitor terminal and to one or more of the word lines; and a control circuit coupled to the first and second switching circuits and to the interface circuit, the control circuit operable to charge the first capacitor by causing the first and second switching circuits to respectively couple the first capacitor terminal to the first voltage terminal and the second capacitor terminal to the second voltage terminal, the control circuit operable to generate a first programming voltage on the one or more word lines by causing the first and second switching circuits to respectively couple the first capacitor terminal to the second voltage terminal and uncouple the second capacitor terminal from the second voltage terminal and by causing the interface circuit to couple the second capacitor terminal to the one or more word lines.

12. The memory of claim 11 wherein the interface circuit comprises:

a first switch having a control terminal, a first terminal coupled to the second capacitor terminal, and a second terminal coupled to the one or more word lines;

a second capacitor having a first capacitor terminal and having a second capacitor terminal coupled to the control terminal of the first switch;

a third switching circuit coupled to the first capacitor terminal of the second capacitor and to the first and second voltage terminals;

a fourth switching circuit coupled to the second capacitor terminal of the second capacitor and to the second voltage terminal; and the control circuit operable to charge the second capacitor by causing the third and fourth switching circuits to respectively couple the first capacitor terminal of the second capacitor to the first voltage terminal and the second capacitor terminal of the second capacitor to the second voltage terminal, the control circuit operable to close the first switch by causing the third and fourth switching circuits to respectively couple the first capacitor terminal of the second capacitor to the second voltage terminal and uncouple the second capacitor terminal of the second capacitor from the second voltage terminal.

13. The memory of claim 11, further comprising:

switches each coupled to the control circuit and between the first voltage terminal and a respective word line; and the control circuit operable to generate a second programming voltage on a selected one of the word lines by closing a respective one of the switches.

14. A memory, comprising:

first and second voltage terminals;

non-volatile memory cells arranged in rows;

word lines each coupled to the memory cells in a respective row;

a first capacitor having first and second terminals;

a first switch having a control terminal, a first terminal coupled to the first voltage terminal, and a second terminal coupled to the first terminal of the first capacitor;

a second switch having a control terminal, a first terminal coupled to the first terminal of the first capacitor, and a second terminal coupled to the second voltage terminal;

a third switch having a control terminal, a first terminal coupled to the second terminal of the first capacitor, and a second terminal coupled to the second voltage terminal;

a fourth switch having a control terminal, a first terminal coupled to the second terminal of the first capacitor, and a second terminal coupled to at least one of the word lines;

a second capacitor having first and second terminals;

a fifth switch having a control terminal, a first terminal coupled to the first voltage terminal, and a second terminal coupled to the first terminal of the second capacitor;

a sixth switch having a control terminal, a first terminal coupled to the first terminal of the second capacitor, and a second terminal coupled to the second voltage terminal;

a seventh switch having a control terminal, a first terminal coupled the second terminal of the second capacitor, and a second terminal coupled to the second voltage terminal; and a control circuit coupled to the control terminals of the first, second, third, fourth, fifth, sixth, and seventh switches.

15. The memory of claim 14, further comprising one or more eighth switches each having a control terminal coupled to the control circuit, a first terminal coupled to the first voltage terminal, and a second terminal coupled to a respective one of the at least one of the word lines.

16. The memory of claim 14 wherein the first, second, third, fourth, fifth, sixth, and seventh switches each comprise a respective field-effect transistor.

17. The memory of claim 14 wherein:

the first, second, fifth, and sixth switches each comprise a respective n-channel transistor; and the third, fourth, and seventh switches each comprise a respective p-channel transistor.

* * * * *